US006821829B1

(12) United States Patent
Peatman et al.

(10) Patent No.: US 6,821,829 B1
(45) Date of Patent: Nov. 23, 2004

(54) METHOD OF MANUFACTURING A SEMICONDUCTOR COMPONENT AND SEMICONDUCTOR COMPONENT THEREOF

(75) Inventors: William C. Peatman, Phoenix, AZ (US); Eric S. Johnson, Scottsdale, AZ (US); Adolfo C. Reyes, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 09/592,349

(22) Filed: Jun. 12, 2000

(51) Int. Cl.[7] .......................................... H01L 21/338
(52) U.S. Cl. ...................................... 438/167; 438/172
(58) Field of Search ................................ 438/167, 172; 257/192, 194

(56) References Cited

U.S. PATENT DOCUMENTS

| 4,814,851 A | 3/1989 | Abrokwah et al. ............ 357/42 |
| 5,124,762 A | 6/1992 | Childs et al. ................. 357/16 |
| 5,331,185 A | 7/1994 | Kuwata |
| 5,455,183 A | 10/1995 | Swirhun ...................... 437/24 |
| 5,479,033 A | 12/1995 | Baca et al. ................... 257/192 |
| 5,514,891 A | 5/1996 | Abrokwah et al. ......... 257/346 |
| 5,614,739 A | 3/1997 | Abrokwah et al. ......... 257/192 |
| 5,677,554 A | 10/1997 | Swirhun ..................... 257/192 |
| 5,693,544 A | 12/1997 | Abrokwah et al. ........... 437/36 |
| 5,701,019 A | 12/1997 | Matsumoto et al. |
| 5,895,929 A * | 4/1999 | Abrokwah et al. ............ 257/20 |
| 5,900,641 A * | 5/1999 | Hara et al. .................... 257/20 |
| 5,937,285 A * | 8/1999 | Abrokwah et al. ......... 438/172 |
| 6,008,509 A | 12/1999 | Inai et al. .................... 257/192 |

FOREIGN PATENT DOCUMENTS

| JP | 61231769 | 10/1986 |
| JP | 62268165 | 11/1987 |
| JP | 401124267 | * 5/1989 |

OTHER PUBLICATIONS

J. Hallmark et al., "Complementary GAAS (CGaAs™) Technology and Applications", ISSSE Conference, 1995.
E. Glass et al., "A True Enhancement Mode Device Technology Suitable for Dual Mode Dual Band Power Amplifier Applications" IEEE–RFIC Symposium, May 1999.
Boissenot, P. et al., "A 0.4–um gate length AlGaAs/GaAs P–channel HIGFET with 127–mS/mm transconcutance at 77K," IEEE electron device letters, 11 (Jul. 1990), No. 7.

* cited by examiner

Primary Examiner—Douglas Wille (57) ABSTRACT

A method of manufacturing a semiconductor component includes providing a substrate (110) with a surface (119), providing a layer (120) of undoped gallium arsenide over the surface of the substrate, forming a gate contact (210) over a first portion of the layer, and removing a second portion of the layer.

16 Claims, 5 Drawing Sheets

METHOD OF MANUFACTURING A SEMICONDUCTOR COMPONENT AND SEMICONDUCTOR COMPONENT THEREOF

FIELD OF THE INVENTION

This invention relates, in general, to electronics, and more particularly, to methods of manufacturing semiconductor components and semiconductor components thereof.

BACKGROUND OF THE INVENTION

Heterostructure Insulated Gate Field Effect Transistors (HIGFETs) are well-known to those skilled in the art and are used for a variety of applications including complimentary digital circuits and enhancement mode power amplifier circuits. Some prior HIGFETs are formed by growing a gallium arsenide capping layer of three nanometers over a heterostructure substrate. The heterostructure substrate includes an aluminum gallium arsenide barrier layer over an indium gallium arsenide channel layer, which in turn is located over a conducting semiconductor layer. One problem with these prior HIGFETs is their large variability in output current.

Accordingly, a need exists for a method of manufacturing a semiconductor component and a semiconductor component thereof that has lower variability in direct current (dc) and radio frequency (rf) output currents and has other improved electrical performance characteristics for digital and analog circuit applications.

BRIEF DESCRIPTION OF THE DRAWINGS

The invention will be better understood from a reading of the following detailed description, taken in conjunction with the accompanying drawing figures in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances. Moreover, the terms over, under, and the like in the description and in the claims, if any, are used for descriptive purposes and not necessarily for describing relative positions. It is understood that the terms so used are interchangeable under appropriate circumstances. It is further understood that the embodiments of the invention described herein are capable of being manufactured or operated in other orientations than described or illustrated herein.

DETAILED DESCRIPTION OF THE DRAWINGS

Figure 1:
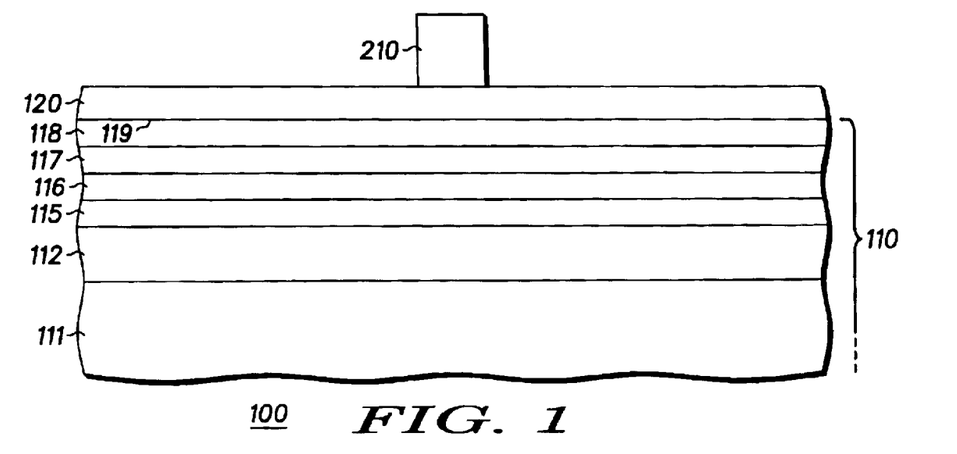
FIGS. 1, 2, 3, and 4 illustrate cross-sectional views of a semiconductor component during different steps of a manufacturing process in accordance with an embodiment of the invention.

FIGS. 1, 2, 3, and 4 illustrate cross-sectional views of a semiconductor component 100 during different steps of a manufacturing process. In FIG. 1, a substrate 110 is provided with a surface 119. In the preferred embodiment, substrate 110 is a delta-doped, heteroepitaxial semiconductor structure. As an example, substrate 110 can include a support layer 111 comprised of semi-insulating gallium arsenide. Substrate 110 can further include a buffer layer 112 overlaying support layer 111, a doping layer 115 overlaying buffer layer 112, a spacer layer 116 overlying doping layer 115, a channel layer 117 overlaying spacer layer 116, and a barrier layer 118 overlaying channel layer 117.

Buffer layer 112 can be comprised of a single layer or a plurality of layers and can have a thickness of approximately one hundred to three hundred nanometers. Buffer layer 112 can be comprised of gallium arsenide and/or aluminium gallium arsenide. In the preferred embodiment, buffer layer 112 consists essentially of undoped gallium arsenide and is located on support layer 111. As used herein, the term "undoped" is defined as a doping level of less than approximately $1 \times 10^{15}$ atoms per centimeter squared.

Doping layer 115 can be a delta-doped or non-delta-doped layer. As an example, doping layer 115 can be comprised of gallium arsenide delta-doped with a dopant such as, for example, silicon to a doping concentration of approximately $1 \times 10^{11}$ to $5 \times 10^{12}$ atoms per centimeter squared. In the preferred embodiment, doping layer 115 consists essentially of gallium arsenide and silicon and is located on buffer layer 112.

Spacer layer 116 can have a thickness of approximately two to four nanometers. Spacer layer 116 can be comprised of gallium arsenide. In the preferred embodiment, spacer layer 116 consists essentially of undoped gallium arsenide and is located on doping layer 115.

Channel layer 117 can have a thickness of approximately ten to twenty nanometers. Channel layer 117 can be comprised of indium gallium arsenide or another semiconductor. In the preferred embodiment, channel layer 117 is located on spacer layer 116 and consists essentially of indium gallium arsenide having an indium mole fraction of approximately fifteen to twenty percent.

Barrier layer 118 can have a thickness of approximately fifteen to thirty-five nanometers. Barrier layer 118 can be comprised of aluminum gallium arsenide. In the preferred embodiment, barrier layer 118 consists essentially of aluminum gallium arsenide having a high aluminum mole fraction of approximately seventy-five percent. A top surface of barrier layer 118 forms surface 1119 for substrate 110 and is located on channel layer 117.

Next, a layer 120 is provided over surface 119 of substrate 110. Layer 120 can be comprised of gallium arsenide. Other equivalent materials that can be used for layer 120 include indium gallium nitride, indium gallium phosphide, and indium gallium aluminum phosphide. In the preferred embodiment, layer 120 consists essentially of undoped gallium arsenide. As an example, layer 120 can have a thickness of approximately three to twelve nanometers. In the preferred embodiment, layer 120 has a thickness of approximately six to nine nanometers. Also, in the preferred embodiment, layer 120 is located on surface 119 of substrate 110.

Next, a gate contact 210 is formed over layer 120. In the preferred embodiment, gate contact 210 is located on layer 120. As illustrated in FIG. 1, gate contact 210 covers a first portion of layer 120 and is absent over a second portion of layer 120.

As an example, gate contact 210 can be formed using the following process. First, a metal layer is formed over layer 120. As an example, the metal layer can have a thickness of approximately three hundred to five hundred nanometers and can consists essentially of titanium tungsten nitride, titanium tungsten, titanium, or tungsten. Next, an etch mask can be formed over the metal layer. As an example, the etch mask can be comprised of photoresist. The metal layer can be etched using a dry etch process, and then the etch mask can be removed. The etching or patterning of the metal layer forms gate contact 210 over the first portion of layer 120 and also over a first portion of surface 119 of substrate 110. The etching or patterning of the metal layer also exposes the second portion of layer 120.

Figure 2:
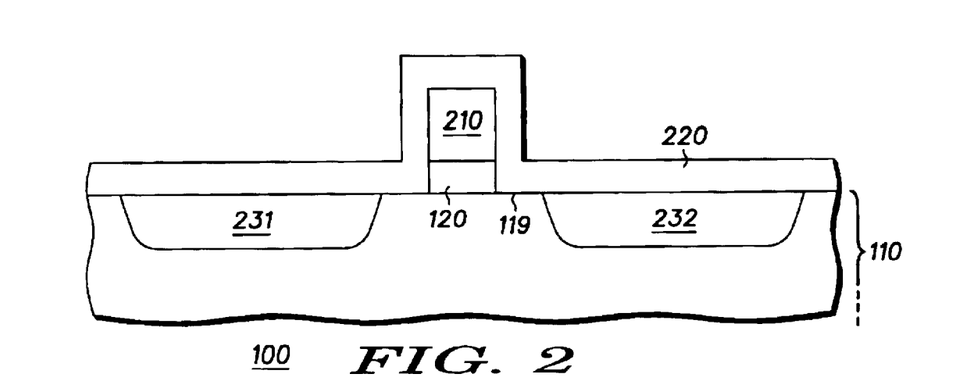

Turning to FIG. 2, substrate 110 is illustrated in simplified form and does not show the plurality of layers described in FIG. 1. As illustrated in FIG. 2, the second portion of layer 120 is removed. As an example, the second portion of layer 120 can be removed using a wet etchant comprised of citric acid monohydrate, hydrogen peroxide, and water. The removal of the second portion of layer 120 after forming gate contact 210 exposes a second portion of surface 119 of substrate 110. This removal process keeps the first portion of layer 120 underneath gate contact 210. Furthermore, this first portion of layer 120 preferably remains undoped.

Then, an electrically insulating layer 220 is formed over gate contact 210, layer 120, and surface 119 of substrate 110. In the preferred embodiment, layer 220 is formed on gate contact 210 and surface 119 of substrate 110. Layer 220 can be comprised of a dielectric material such as silicon oxide, silicon nitride, or silicon oxy-nitride. In the preferred embodiment, layer 220 is comprised of silicon nitride that is deposited using a high frequency chemical vapor deposition process. As an example, layer 220 can have a thickness of approximately twenty to sixty nanometers.

Next, lightly doped source region 231 and lightly doped drain region 232 can be formed in substrate 110 after removing the second portion of layer 120. As an example, regions 231 and 232 can be implanted through layer 220 and into surface 119 of substrate 110. Furthermore, regions 231 and 232 can be defined by an implant mask comprised of photoresist or can be defined using the remaining portion of layer 120 as the implant mask. In the preferred embodiment, regions 231 and 232 have an n-type conductivity and extend from surface 119 of substrate 110 into buffer layer 112 (FIG. 1) of substrate 110, but do not extend into support layer 111 (FIG. 1) of substrate 110.

Figure 3:
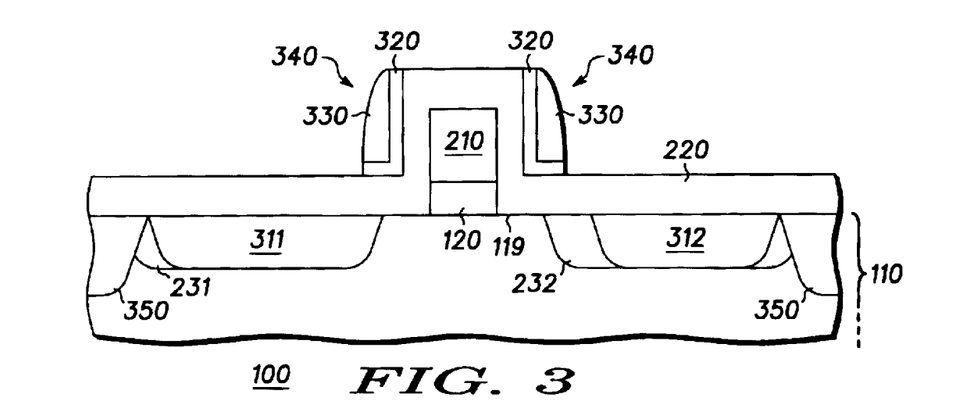

Subsequently, turning to FIG. 3, a source region 311 and a drain region 312 can be formed in substrate 110 after removing the second portion of layer 120. As an example, regions 311 and 312 can be implanted through layer 220 and into surface 119 of substrate 110 and can be defined by an implant mask comprised of photoresist. Similar to lightly doped source and drain regions 231 and 232, source and drain regions 311 and 312 preferably extend from surface 119 of substrate 110 into buffer layer 112 (FIG. 1) of substrate 110, but preferably do not extend into support layer 111 (FIG. 1) of substrate 110.

Next, a spacer 340 can be formed adjacent to gate contact 210 after removing the second portion of layer 120. Spacer 340 can be comprised of a single layer, but is preferably comprised of multiple layers. As an example of a multi-layered spacer, a first electrically insulating layer 320 can be formed over layer 220, and then a second electrically insulating layer 330 can be formed over layer 320. Layers 320 and 330 can be comprised of different dielectric materials. In the preferred embodiment, layer 320 is comprised of aluminum nitride, and layer 330 is comprised of tetra-ethyl-ortho-silicate (TEOS), which is a form of silicon oxide. As an example, layer 320 can have a thickness of approximately twenty to forty nanometers, and layer 330 can have a thickness of approximately three hundred to four hundred nanometers. Next, layer 330 can be etched anisotropically with a dry etchant, and then layer 320 can be etched isotropically with a wet etchant.

Then, regions 231, 232, 311, and 312 in substrate 110 are annealed. In the preferred embodiment, this annealing step occurs after removing the second portion of layer 120 and also occurs after forming layer 220. The anneal process activates the dopants in regions 231, 232, 311, and 312, and the annealing process also increases the density of layer 220 to protect substrate 110.

Subsequently, electrical isolation regions 350 are formed in substrate 110. As an example, regions 350 can be implanted through layer 220 and into surface 119 of substrate 110 and can be defined by an implant etch mask comprised of photoresist. In the preferred embodiment, regions 350 extend from surface 119 of substrate 110 into support layer 111 (FIG. 1) of substrate 110.

Figure 4:
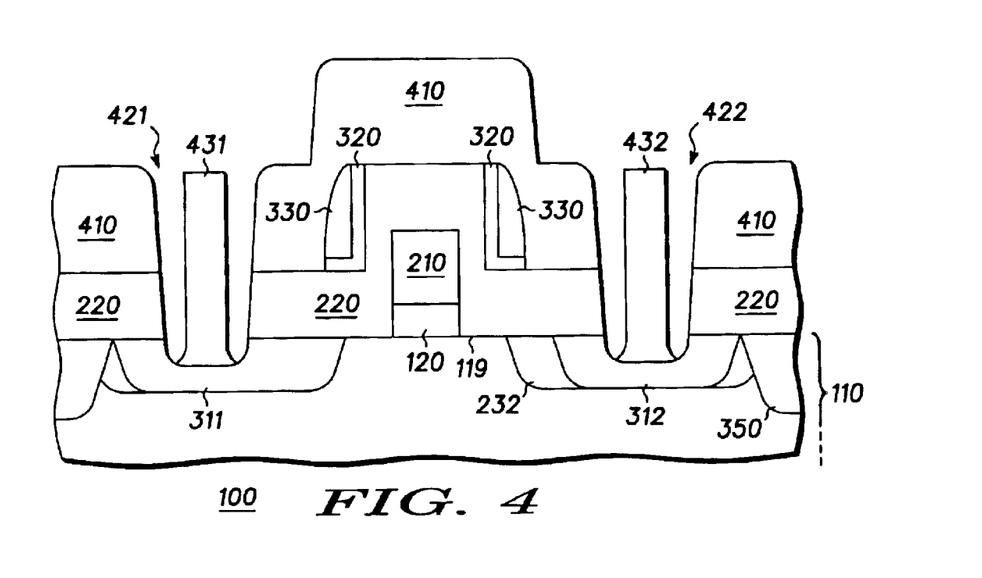

Referring to FIG. 4, an electrically insulating layer 410 is formed over spacer 340 and layer 220. As an example, layer 410 can be comprised of a dielectric material. In the preferred embodiment, layer 410 is comprised of silicon dioxide and can have a thickness of approximately one hundred to four hundred nanometers.

Next, source contact via 421 and drain contact via 422 are formed in layer 410, layer 220, and substrate 110. In the preferred embodiment, vias 421 and 422 extend below the surface 119 and into layers 118, 117, 116, 115, and 112 (FIG. 1) of substrate 110, but preferably do not extend into layer 111 (FIG. 1) of substrate 110.

Next, source contact 431 and drain contact 432 are formed in source contact via 421 and drain contact via 422, respectively, and over source region 311 and drain region 312, respectively. Source and drain contacts 431 and 432 are ohmic contacts. In the preferred embodiment, contacts 431 and 432 are comprised of nickel, germanium, and gold and are patterned using a lift-off process. After the lift-off process defines contacts 431 and 432, a high-temperature step anneals contacts 431 and 432. Subsequent manufacturing steps form at least one interconnect layer electrically coupled to contacts 431 and 432 and also to gate contact 210.

Figure 5:
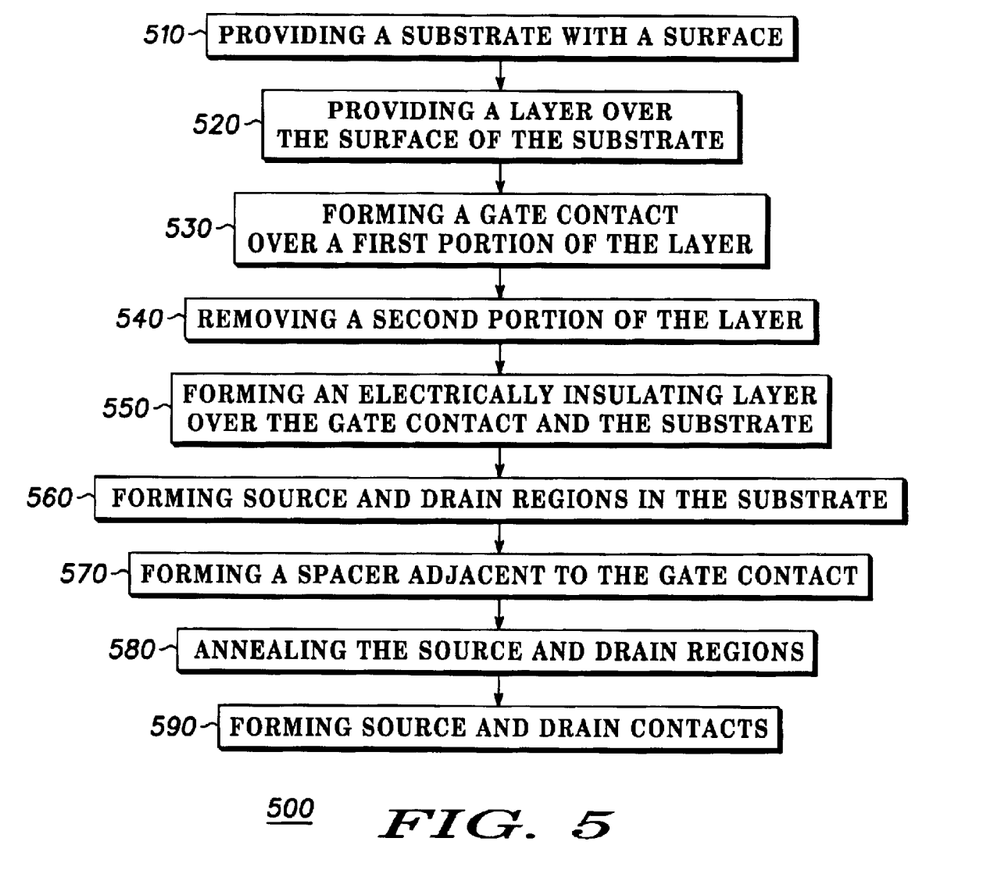
FIG. 5 illustrates a flow chart of a method of manufacturing the semiconductor component illustrated in FIGS. 1, 2, 3, and 4 in accordance with an embodiment of the invention.

FIG. 5 illustrates a flow chart of a method 500 of manufacturing semiconductor component 100 illustrated in FIGS. 1, 2, 3, and 4. At a step 510 of method 500 in FIG. 5, a substrate with a surface is provided. Next, at a step 520 in method 500, a layer comprised of undoped gallium arsenide is provided over the surface of the substrate. At a step 530, a gate contact is formed over a first portion of the layer, and at a step 540, a second portion of the layer is subsequently removed to expose a portion of the surface of the substrate. Subsequently, at a step 550, an electrically insulating layer is formed over the gate contact and the substrate, and at a step 560, source and drain regions are formed in the substrate. Then, at a step 570, a spacer is formed adjacent to the gate contact, and at a step 580, the source and drain regions are annealed. Next, at a step 590 of method 500, source and drain contacts are formed over the source and drain regions.

Electrical tests of semiconductor components manufactured using the method described in FIGS. 1, 2, 3, 4, and 5 show many improvements. For example, the standard deviation of the channel sheet resistance in the semiconductor components is greatly reduced, and the standard deviation of the output current of the semiconductor components are also greatly reduced. Additionally, the semiconductor components have lower gate leakage currents. Furthermore, the turn-on voltage for these semiconductor components is higher, which allows for larger input and output, dc and rf power levels. The dc and rf output currents, and thus the dc and rf power, of these semiconductor components can also be increased by increasing the delta-doping concentration in the substrate. This increase in output current can be accomplished while maintaining the breakdown voltage by adjusting the implant profiles of the lightly doped source and drain regions and the source and drain regions.

Figure 6:
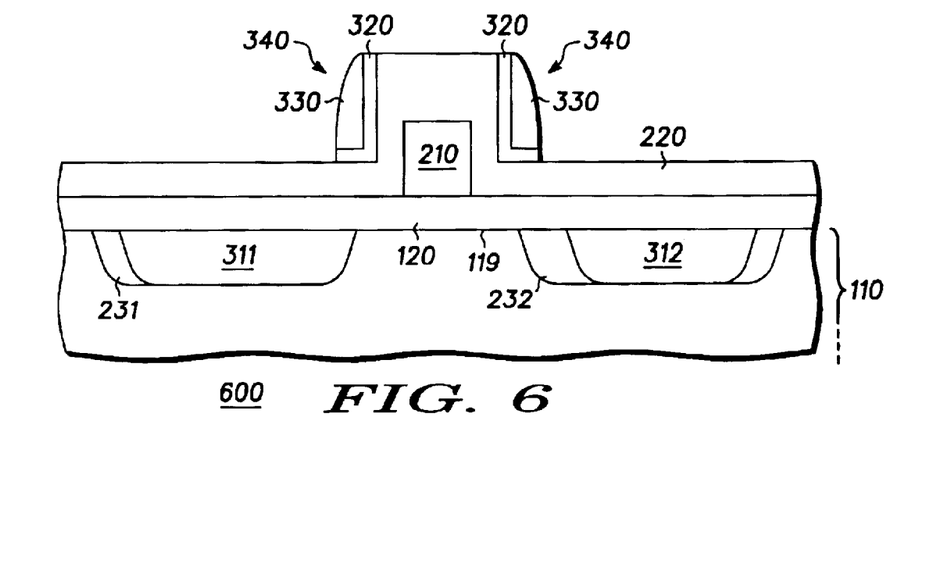
FIGS. 6, 7, and 8 illustrate cross-sectional views of another semiconductor component during different steps of another manufacturing process in accordance with an embodiment of the invention.
Figure 7:
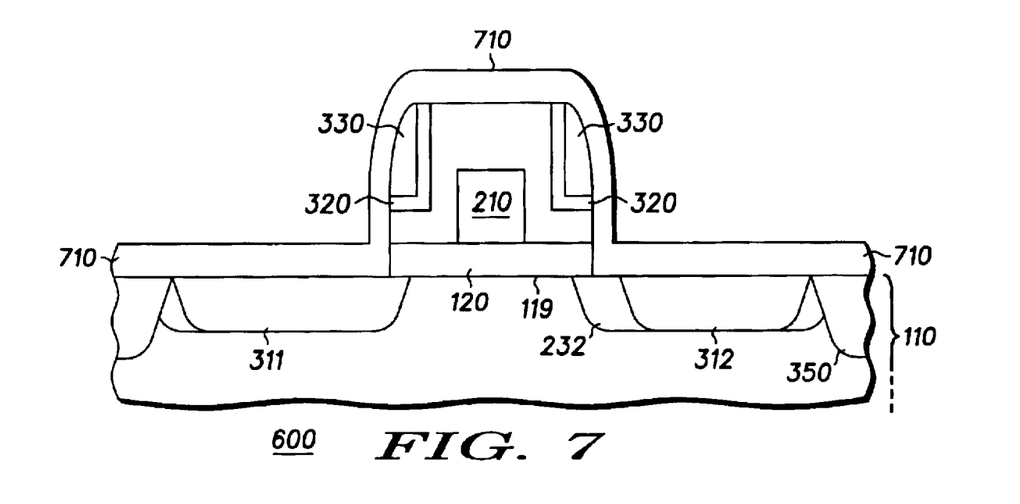
Figure 8:
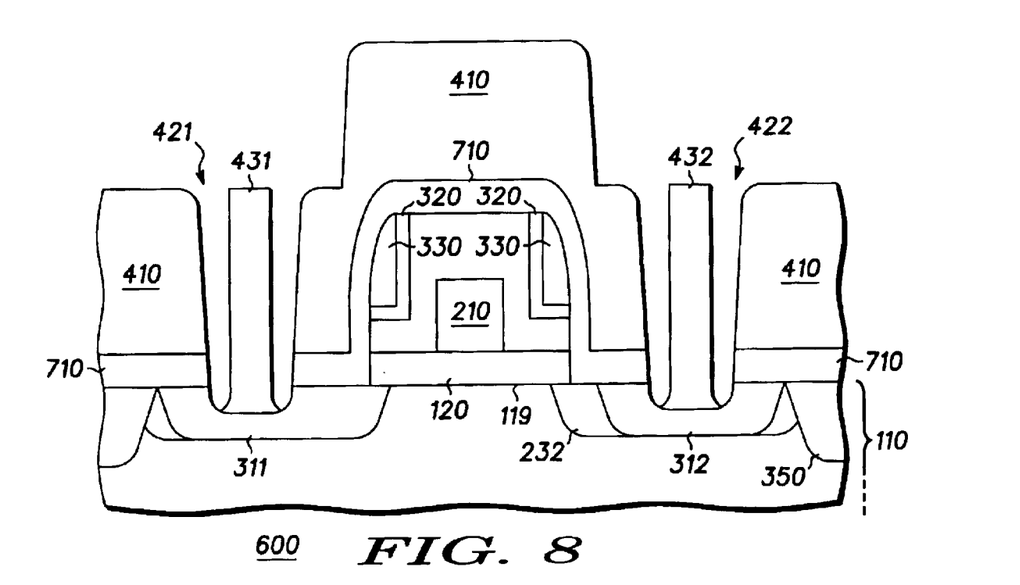

FIGS. 6, 7, and 8 illustrate cross-sectional views of a semiconductor component 600 during different steps of another manufacturing process. Component 600 is a different embodiment of component 100 in FIGS. 1, 2, 3, and 4. As illustrated in FIG. 6, component 600 includes substrate 110, layer 120, and gate contact 210. However, the second portion of layer 120 is not etched or removed right after forming gate contact 210. Instead, layer 220 is formed over gate contact 210 and layer 120 before removing the second portion of layer 120. Furthermore, lightly doped source and drain regions 231 and 232 and source and drain regions 311 and 312 are formed in substrate 110 before removing the second portion of layer 120. Then, spacer 340 is formed adjacent to gate contact 210 before removing the second portion of layer 120.

After forming regions 231, 232, 311, and 312 in substrate 110 and after forming spacer 340, the second portion of layer 120 is removed. This removal process first involves removing an overlying portion of layer 220 and then removing the second portion of layer 120. As illustrated in FIG. 7, the first portion of layer 120 remains underneath gate contact 210 after removing the second portion of layer 120, and a third portion of layer 120 remains underneath spacer 340 after removing the second portion of layer 120.

Then, an electrically insulating layer 710 is formed over spacer 340, gate contact 210, and the remaining portions of layer 120. As an example, layer 710 can be similar to layer 220, but layer 710 preferably has a thickness greater than that of layer 220. Next, regions 231, 232, 311, and 312 are annealed. This anneal process also increases the density of layer 710. Subsequently, electrical isolation regions 350 are formed in substrate 110.

Turning to FIG. 8, electrically insulative layer 410 is deposited, and source and drain contact vias 421 and 422 are also formed. Next, source and drain contacts 431 and 432 are formed within vias 421 and 422, and contacts 431 and 432 are annealed.

Figure 9:
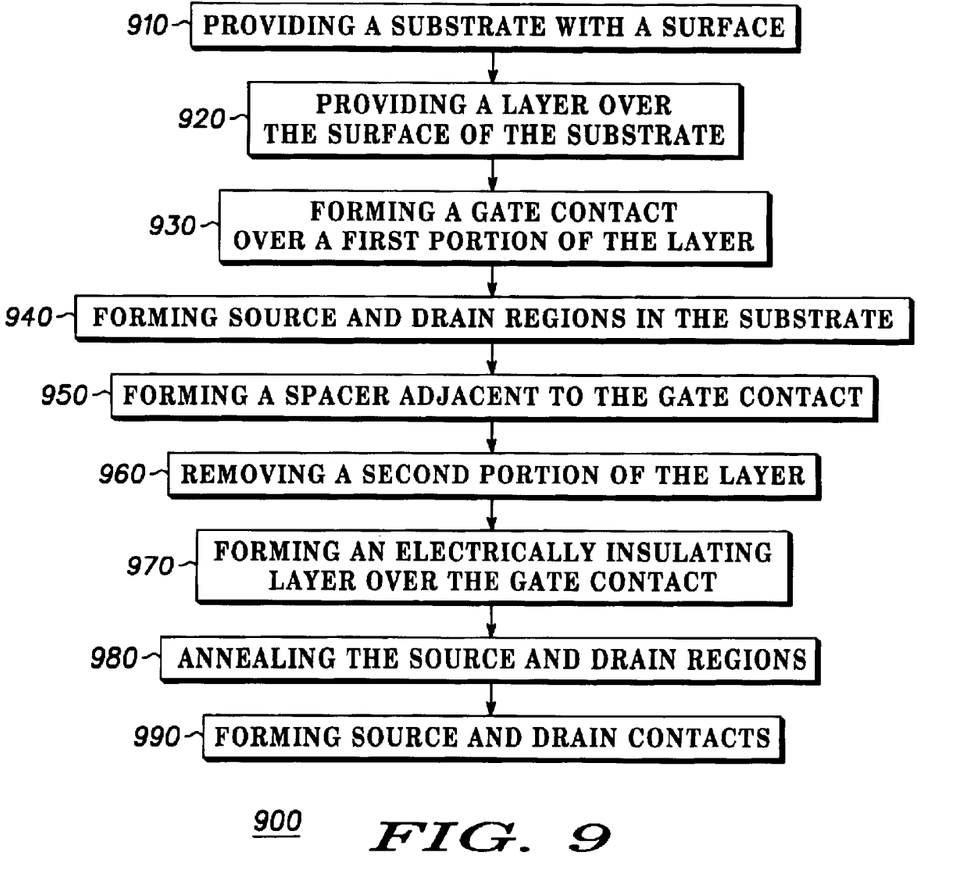
FIG. 9 illustrates a flow chart of a method of manufacturing the semiconductor component illustrated in FIGS. 6, 7, and 8 in accordance with an embodiment of the invention.

FIG. 9 illustrates a flow chart of a method 900 of manufacturing semiconductor component 600 illustrated in FIGS. 6, 7, and B. At a step 910 of method 900 in FIG. 9, a substrate is provided with a surface. At a step 920 of method 900, a layer comprised of semi-insulting gallium arsenide is provided over the surface of the substrate. At a step 930, a gate contact is formed over a first portion of the layer. Next, at a step 940, source and drain regions are formed in the substrate, and at a step 950, a spacer is formed adjacent to the gate contact. Then, at a step 960, a second portion of the layer is removed. Next, at a step 970, an electrically insulating layer is formed over the gate contact and the substrate, and at a step 980, the source and drain regions are annealed. Subsequently, at a step 990 of method 900, source and drain contacts are formed over the source and drain regions.

Therefore, an improved method of manufacturing a semiconductor component and semiconductor component thereof are provided to overcome the disadvantages of the prior art. The semiconductor components have improved electrical performance characteristics including greatly reduced variations in sheet resistance, dc and rf output currents, and breakdown voltage. Furthermore, the semiconductor components may have higher turn-on voltages and lower gate leakage currents. The semiconductor components additionally have well-controlled, positive threshold voltages, which is very well suited for digital and analog circuit applications.

Although the invention has been described with reference to specific embodiments, it will be understood by those skilled in the art that various changes may be made without departing from the spirit or scope of the invention. For instance, the numerous details set forth herein such as, for example, chemical concentrations, material compositions, and layer thicknesses are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a semiconductor component comprising:
   providing a delta-doped heteroepitaxial semiconductor structure substrate with a surface;
   providing a layer of undoped gallium arsenide on the surface of the delta-doped heteroepitaxial semiconductor structure substrate, the layer having a thickness on the order of six to twelve nanometers;
   forming a gate contact on a first portion of the undoped gallium arsenide layer; and
   removing a second portion of the undoped gallium arsenide layer to expose a portion of the surface of the delta-doped heteroepitaxial semiconductor structure substrate, wherein the remaining first portion of the undoped gallium arsenide layer does not substantially extend beyond the horizontal profile of the gate contact.

2. The method of claim 1 wherein:
   the undoped gallium arsenide layer further comprises a thickness on the order of six to nine nanometers of undoped gallium arsenide.

3. The method of claim 1 wherein:
   forming the gate contact includes exposing the second portion of the undoped gallium arsenide layer.

4. The method of claim 1 further comprising:
   implanting source and drain regions into the delta-doped heteroepitaxial semiconductor structure substrate after removing the second portion of the undoped gallium arsenide layer, wherein the first portion of the undoped gallium arsenide layer remains undoped.

5. The method of claim 1 further comprising:
   implanting source and drain regions into the delta-doped heteroepitaxial semiconductor structure substrate before removing the second portion of the undoped gallium arsenide layer, wherein the first portion of the undoped gallium arsenide layer remains undoped.

6. The method of claim 1 further comprising:

forming a spacer adjacent to the gate contact after removing the second portion of the undoped gallium arsenide layer.

7. The method of claim 1 further comprising:

forming a spacer adjacent to the gate contact before removing the second portion of the undoped gallium arsenide layer.

8. The method of claim 7 further comprising:

keeping a third portion of the undoped gallium arsenide layer underneath the spacer after removing the second portion of the layer.

9. The method of claim 1, wherein the delta-doped heteroepitaxial semiconductor structure substrate includes:

a semi-insulating gallium arsenide support layer;

a buffer layer overlying the support layer, the buffer layer having a thickness on the order of one hundred to three hundred nanometers;

a doping layer overlying the buffer layer;

a spacer layer overlying the doping layer, the spacer layer having a thickness on the order of two to four nanometers;

a channel layer overlying the spacer layer, the channel layer having a thickness on the order of ten to twenty nanometers; and a barrier layer overlying the channel layer, the barrier layer having a thickness on the order of fifteen to thirty-five nanometers.

10. The method of claim 1 further comprising:

forming a dielectric layer over the gate contact, the remaining first portion of the undoped gallium arsenide layer and the exposed portion of the surface of the delta-doped heteroepitaxial semiconductor structure substrate, the dielectric layer having a thickness on the order of twenty to sixty nanometers;

implanting source and drain regions through the dielectric layer and into the surface of the delta-doped heteroepitaxial semiconductor structure substrate, the implant regions extending from the surface of the delta-doped heteroepitaxial semiconductor structure substrate into a buffer layer of the substrate but not extending into a support layer of the substrate, wherein the first portion of the undoped gallium arsenide layer remains undoped;

annealing the source and drain regions, wherein annealing activates dopants in the implanted source and drain regions and increases a density of the dielectric layer; and forming source and drain contacts over the source and drain regions in respective source and drain contact vias, the source and drain contact vias extending through the dielectric layer and extending from the surface of the delta-doped heteroepitaxial semiconductor structure substrate into the buffer layer of the substrate but not extending into the support layer of the substrate.

11. A method of manufacturing a semiconductor component comprising:

providing a delta-doped, heteroepitaxial semiconductor substrate with a surface, the delta-doped, heteroepitaxial semiconductor substrate comprising:

a support layer comprised of semi-insulating gallium arsenide;

a buffer layer comprised of undoped gallium arsenide overlying the support layer, the buffer layer having a thickness on the order of 100–300 nanometers;

a doping layer delta-doped with silicon and overlying the buffer layer;

a spacer layer comprised of undoped gallium arsenide and overlying the doping layer, the spacer layer having a thickness on the order of 2–4 nanometers;

a channel layer comprised of indium gallium arsenide and overlying the spacer layer, the channel layer having a thickness on the order of 10–20 nanometers; and a barrier layer comprised of aluminum gallium arsenide and overlying the channel layer, the barrier layer having a thickness on the order of 15–35 nanometers and forming the surface for the delta-doped, heteroepitaxial semiconductor substrate;

providing an undoped gallium arsenide capping layer on the surface of the delta-doped, heteroepitaxial semiconductor substrate, the capping layer having a thickness on the order of 6–12 nanometers;

forming a gate contact on the undoped gallium arsenide capping layer, the gate contact covering a first portion of the undoped gallium arsenide capping layer and being absent over a second portion of the undoped gallium arsenide capping layer;

removing the second portion of the undoped gallium arsenide capping layer after forming the gate contact to expose a portion of the surface of the delta-doped, heteroepitaxial semiconductor substrate, wherein the remaining first portion of said undoped gallium arsenide capping layer does not substantially extend beyond the horizontal profile of said gate contact;

forming a spacer adjacent to the gate contact;

forming source and drain regions in the delta-doped, heteroepitaxial semiconductor substrate; and forming source and drain contacts over the source and drain regions in respective source and drain contact vias, the source and drain contact vias extending through the dielectric layer and extending from the surface of the delta-doped heteroepitaxial semiconductor substrate into the buffer layer of the substrate but not extending into the support layer of the substrate.

12. The method of claim 11 wherein:

forming the source and drain regions further comprises implanting the source and drain regions through the dielectric layer and into the surface of the delta-doped, heteroepitaxial semiconductor substrate after removing the second portion of the undoped gallium arsenide capping layer, the implant regions extending from the surface of the delta-doped heteroepitaxial semiconductor substrate into a buffer layer of the substrate but not extending into a support layer of the substrate, wherein the first portion of the undoped gallium arsenide layer remains undoped; and forming the spacer further comprises forming a multilayered spacer adjacent to the gate contact after removing the second portion of the undoped gallium arsenide capping layer.

13. The method of claim 11 further comprising:

forming the source and drain regions further comprises implanting source and drain regions through the dielectric layer and into the surface of the delta-doped, heteroepitaxial semiconductor substrate before removing the second portion of the undoped gallium arsenide capping layer, the implant regions extending from the surface of the delta-doped heteroepitaxial semiconductor structure substrate into a buffer layer of the substrate but not extending into a support layer of the substrate, wherein the first position of the undoped gallium arsenide layer remains undoped;

forming the spacer further comprises forming a multi-layered spacer adjacent to the gate contact before removing the second portion of the undoped gallium arsenide capping layer; and keeping a third portion of the undoped gallium arsenide capping layer underneath the multi-layered spacer after removing the second portion of the undoped gallium arsenide capping layer.

14. The method of claim 11 wherein:

providing the undoped gallium arsenide capping layer further comprises providing the undoped gallium arsenide capping layer with a thickness on the order of six to nine nanometers.

15. The method of claim 11 wherein:

providing the delta-doped, heteroepitaxial semiconductor substrate further comprises:
  providing the buffer layer on the support layer and consisting essentially of gallium arsenide;
  providing the doping layer on the buffer layer and consisting essentially of silicon and gallium arsenide;
  providing the spacer layer on the doping layer and consisting essentially of gallium arsenide;
  providing the channel layer on the spacer layer and consisting essentially of indium gallium arsenide; and
  providing the barrier layer on the channel layer and consisting essentially of aluminum gallium arsenide;

providing the undoped gallium arsenide capping layer further comprises:
  providing the undoped gallium arsenide capping layer on the barrier layer;

forming the gate contact further comprises:
  forming the gate contact on the first portion of the undoped gallium arsenide capping layer; and removing the second portion of the undoped gallium arsenide capping layer further comprises:
  removing the second portion of the undoped gallium arsenide capping layer to expose a portion of the barrier layer.

16. The method of claim 15 further comprising:

annealing the source and drain regions after removing the second portion of the undoped gallium arsenide capping layer, wherein:
  providing the undoped gallium arsenide capping layer further comprises providing the undoped gallium arsenide capping layer with a thickness of approximately six to nine nanometers.

* * * * *

UNITED STATES PATENT AND TRADEMARK OFFICE
CERTIFICATE OF CORRECTION

| | |
|---|---|
| PATENT NO. | : 6,821,829 B1 |
| APPLICATION NO. | : 09/592349 |
| DATED | : November 23, 2004 |
| INVENTOR(S) | : William C. Peatman |

It is certified that error appears in the above-identified patent and that said Letters Patent is hereby corrected as shown below:

Column 8, After Line 36, Claim No. 11:
    Insert --forming a dielectric layer over the gate contact, the remaining first portion of the undoped gallium arsenide capping layer and the exposed portion of the surface of the delta-doped heteroepitoxial semiconductor substrate;--

Signed and Sealed this

Twenty-sixth Day of December, 2006

JON W. DUDAS
*Director of the United States Patent and Trademark Office*